United States Patent [19]
Watabe et al.

[11] Patent Number: 5,169,608
[45] Date of Patent: Dec. 8, 1992

[54] INORGANIC ARTICLE FOR CRYSTAL GROWTH AND LIQUID-PHASE EPITAXY APPARATUS USING THE SAME

[75] Inventors: Shinichi Watabe; Hirotaka Ito, both of Itami; Tokuzo Sukegawa, Hamamatsu, all of Japan

[73] Assignee: Mitsubishi Cable Industries, Ltd., Amagasaka, Japan

[21] Appl. No.: 587,900

[22] Filed: Sep. 25, 1990

[30] Foreign Application Priority Data

Sep. 26, 1989 [JP] Japan .................................. 1-249530
Dec. 19, 1989 [JP] Japan .................................. 1-330313
Dec. 29, 1989 [JP] Japan .................................. 1-340837

[51] Int. Cl.$^5$ ............................................. B01D 9/00
[52] U.S. Cl. ................................... 422/248; 118/412; 118/415; 156/607; 156/624; 156/DIG. 83
[58] Field of Search ............... 156/607, 624, DIG. 83; 118/412, 415; 422/248; 264/114.1; 432/264

[56] References Cited

U.S. PATENT DOCUMENTS

| | | | |
|---|---|---|---|
| 3,615,928 | 10/1971 | Wagner et al. | 156/607 |
| 3,647,578 | 3/1972 | Barnet et al. | 156/624 |
| 3,741,817 | 6/1973 | Bienert et al. | 156/607 |
| 3,996,891 | 12/1976 | Isawa et al. | 156/607 |
| 4,528,163 | 7/1985 | Albrect | 156/DIG. 83 |

Primary Examiner—Robert Kunemund
Assistant Examiner—Felisa Garrett
Attorney, Agent, or Firm—Varndell Legal Group

[57] ABSTRACT

An inorganic article used as a container for holding a solution for crystal growth according to the present invention is provided by filling the pores of substrate having a porous inorganic structure with an inorganic material which has a melting point of 400° to 900° C. A liquid-phase epitaxy apparatus according to the present invention is comprised of a crucible made of the inorganic article or from a material selected from P-BN, quartz and sapphire and has an arrangement with less sliding contact. Thus, the dispersion of diffusive elements contained in a solution during the epitaxial growth is prevented. Accordingly, both the article and the apparatus of the present invention permit growth of crystals having high quality and less structural defects, thus contributing to the production of a semiconductor device made of materials having high vapor pressure.

18 Claims, 4 Drawing Sheets

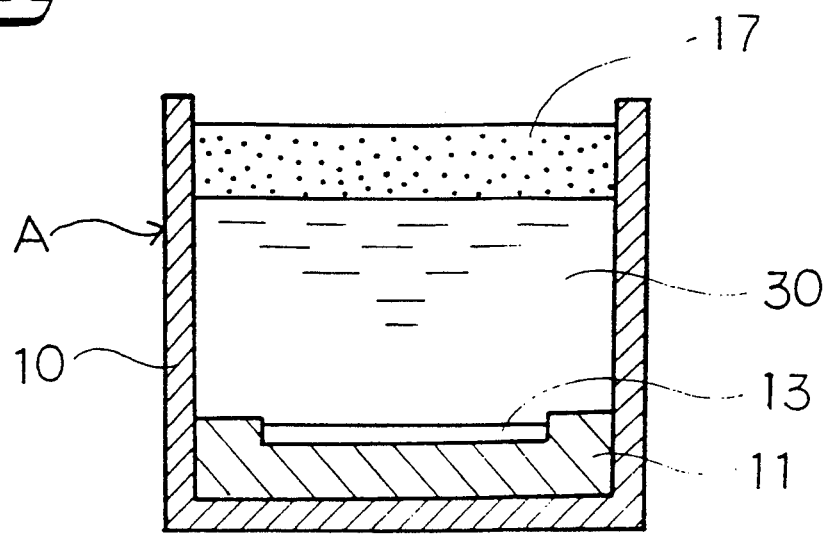
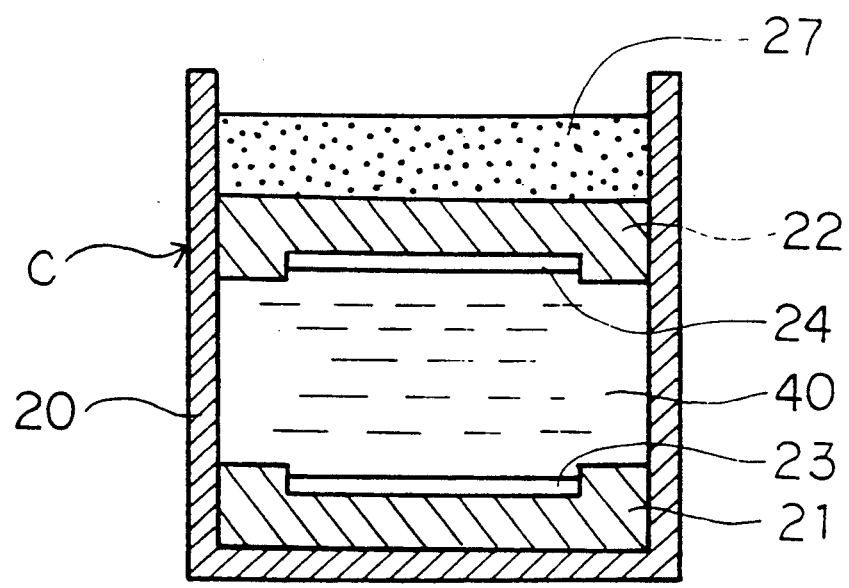

INORGANIC ARTICLE FOR CRYSTAL GROWTH AND LIQUID-PHASE EPITAXY APPARATUS USING THE SAME

BACKGROUND OF THE INVENTION

1. Field of the Invention

The present invention relates to an inorganic article for containing or contacting a solution for crystal growth of a compound semiconductor and a liquid-phase epitaxy apparatus using the same.

2. Description of the Prior Art

There are various types of inorganic devices used for the crystal growth of a compound semiconductor, including a carbon boat (a graphite boat), a container (a crucible), and a lid of the container, which are commonly made of graphite and employed where airtightness is required.

For example, the carbon boat is generally used in a slide boat procedure employed for liquid-phase epitaxy method of the epitaxial growth technology.

In operation of the liquid phase epitaxy, a solution for epitaxial growth is heated to a high temperature (of 700° to 900° C.) and then, cooled down. The solution contains diffusive elements having a high vapor pressure, such as arsenic, phosphorus, and the like and also, the carbon boat must be used in an airtight situation. However, the graphite is generally porous and the carbon boat made of the graphite has a large number of tiny pores on the surface thereof and, thus is unsatisfactory in the airtightness.

As a result, such diffusive elements tend to be dispersed through the tiny pores to the outside of the boat, whereby the stoichiometric composition of the solution will be destroyed causing structural defects of crystals. This disadvantage will become more serious during a longer period of the crystal growth.

The above-mentioned problems related to porousness also apply to porous inorganic structures in general, such as vessels made from graphite or ceramic (e.g. h-BN, $Al_2O_3$, etc.) exemplified by a crucible, lid of vessels and so on.

SUMMARY OF THE INVENTION

A primary object of the present invention is, in view of the aforementioned aspects, to provide a novel inorganic article for crystal growth and more specifically, an inorganic article for growth of crystals on a compound semiconductor in which the dispersion of diffusive elements contained in a solution for epitaxial growth from the tiny pores of the porous inorganic article is prevented.

Another object of the present invention is to provide a liquid-phase epitaxy apparatus in which the dispersion of diffusive elements contained in a solution for epitaxial growth from said apparatus to the outside during the process of epitaxial growth, which has been conventionally observed is prevented.

The first object is achieved by ① an inorganic article for crystal growth, characterized in that the pores of a porous inorganic structure used for the substrate of the article for crystal growth are filled with an inorganic material having a melting point of 400° to 900° C. and also, ② an inorganic article for crystal growth characterized in that the surface and about the pores of the article ① is coated with amorphous carbon or diamond.

The second object is achieved by a liquid-phase epitaxy apparatus according to the present invention which comprises the following arrangements ③ or ④.

The arrangement ③ is characterized by comprising a crucible made of the inorganic article ① or ② or from a material selected from P-BN (pyrolytic boron nitride), quartz and sapphire, in which a substrate holder is disposed in the crucible, and a sealing member is arranged to suspend above the substrate holder, for trapping a solution contained above or beneath the substrate holder at said place.

Also, the arrangement ④ is characterized by comprising a crucible made of the inorganic article ① or ② or from a material selected from P-BN, quartz and sapphire, in which a source crystal holder is disposed in the bottom of the crucible, a substrate holder is arranged above and at a specific distance from the source crystal holder, and a sealing member is arranged to suspend above the substrate holder for trapping a solution contained between the two holders at said place.

According to the inorganic article ① or ② of the present invention, the pores of a substrate having a porous inorganic structure are closed with the particular inorganic material so that the permeability of vapor is sharply declined, whereby the dispersion of diffusive elements contained in the growth solution from the pores to the outside will be prevented as the airtightness is improved.

Particularly, the surface and the pits of the inorganic article ② which has had the pores closed with the inorganic material are additionally coated with amorphous carbon or diamond so that the wear resistance is increased while the vapor permeability is further decreased as compared with the article ①, whereby the generation of carbon dust will be minimized.

Also, each of the apparatuses ③ and ④ of the present invention is comprised of the crucible made of the inorganic article ① or ② or from a material selected from P-BN, quartz and sapphire and has a crucible-like arrangement which provides nearly no sliding contact between the sliding parts and the stationary parts as compared with conventional slide type or piston type boat made from graphite. Hence, the dispersion of diffusive elements contained in the growth solution during the process of epitaxial growth is prevented since the airtightness is improved.

The porous inorganic structures associated with the present invention include various types of porous (or multi-cellular) structures employed for crystal growth of a compound semiconductor which are made of e.g. graphite or ceramic (h-BN, $Al_2O_3$, etc).

The inorganic material for filling into the pores of the porous inorganic structure of the inorganic article ① or ② according to the present invention may be selected without specific limitation, except that the melting point is 400° to 900° C., preferably, 450° to 850° C. and that no chemical reaction with a basic material such as graphite, ceramic and the like nor dissolution into the solution during the liquid phase epitaxy process is allowed. The inorganic materials thus include elements such as Al, Sb, Ba, and Ce, oxides such as $B_2O_3$, $Bi_2O_3$, $Sb_2O_3$, $V_2O_5$, $MoO_3$, $Rb_2O_2$, and $KReO_4$, halides such as $CaCl_2$, $EuBr_2$, $EuI_2$, $LaBr_3$, KCl, $PrBr_3$, $PrCl_3$, $SmBr_2$, $SmI_2$, AgCl, AgI, $YbCl_2$, $PbF_2$, LiBr, LiCl, $MgCl_2$, $MnCl_2$, RbBr, BbI, and NaI, and other compounds such as $Sb_2S_3$, $Li_2CO_3$, and NaCN.

Also, it is preferred that the inorganic material has a boiling point of not less than 1500° C. and more specifically, 1500° to 2250° C. and is less volatile. The inorganic materials satisfying the foregoing conditions include elements such as Al, Sb, Ba, and Ce, oxides such as $B_2O_3$, $Bi_2O_3$, $Sb_2O_3$, and $V_2O_5$, and halides such as $CaCl_2$, $EuBr_2$, $EuI_2$, $LaBr_3$, $KCl$, $PrBr_3$, $PrCl_3$, $SmBr_2$, $SmI_2$, $AgCl$, $AgI$, and $YbCl_2$.

Among the most preferable inorganic materials having desired melting and boiling points are such common oxides as $B_2O_3$, $Bi_2O_3$ and $Sb_2O_3$, of which melting and boiling points are 450° C. and 2250° C., 825° C. and 1890° C., and 656° C. and 1550° C. respectively.

Although the aforementioned inorganic materials suffice for use in the present invention, it is more preferable that in addition to a specific melting and boiling points, its vapor pressure be less than 5 mmHg at a temperature of 900° C. so that the dissipation of the inorganic material which has been filled in the article ① from the tiny pores during the liquid phase epitaxy is minimized, and the addition thereof as an impurity to a growing crystal is decreased as much as possible.

The method of filling the pores of the porous inorganic structure with the inorganic material according to the present invention is not limited to the immersion process of immersing the structure into a solution of the inorganic material as described later and the process in which the pores are filled by applying a pressure at a high temperature after the structure is coated at surface with the inorganic material.

The coating with amorphous carbon or diamond over the surface and the pits of an article, for producing the article ② is conducted after the pores are filled with the inorganic material, and any known coating method may be used with equal success. For example, a process using amorphous carbon may be applied in which the generation of amorphous carbon is carried out at the same time of the coating and more particularly, the coating with amorphous carbon is conducted by a plasma CVD method or common pyrolysis CVD with the use of a gas of carbon material such as hydrocarbon (e.g. methane, acetylene, propane, or butane), ketone (e.g. acetone), alcohol (e.g. methanol or ethanol), aromatic hydrocarbon (e.g. benzene or toluene), or the like. Other procedures including an ion beam sputtering with carbon target and a laser vapor deposition will also be used.

The methods of coating with diamond includes a heat filament method associated with a known thermal CVD apparatus provided with or utilizing a tungsten filament, a plasma CVD method employing a high frequency of not more than 13.5 MHz for energization under the almost same condition as of the thermal filament method, a procedure based on the thermal filament method in which the inorganic structure has a positive potential and between the structure and a filament a bias voltage is applied, a procedure using an ark plasma under about one atmospheric pressure, and a burning flame procedure in which mainly the mixed gas of methane-hydrogen or acetylene gas is burned in atmosphere with the aid of a burner and the inorganic structure cooled down is positioned in a flame for developing a layer of diamond thereon.

The foregoing procedures employ as the carbon material gas a mixture gas of hydrogen and carbon compound, e.g. methane, ethane, butane, ethylene, acetylene, ethanol, acetone, or carbon monoxide.

The thickness of an amorphous carbon or diamond layer may vary depending on the use and size of a component. For example, the layer on a carbon boat is preferably 0.1 to 50 μm, more specifically, 1 to 20 μm, and at optimum, about 5 μm.

The vapor permeability is hence remarkably decreased by additional coating with amorphous carbon or diamond as compared with that by simple filling of the tiny pores with inorganic material. In fact, the air permeability of an amorphous carbon layer is less than $10^{-12}$ $cm^2$/second under the conditions of He and $\Delta P = 1$ atm as compared with 0.1 to 10 $cm^2$/second on a common carbon layer. The layer of diamond remains more stable at a higher temperature and higher in the wear resistance and the thermal conductivity than a layer of amorphous carbon.

The crucibles provided in the apparatuses ③ and ④ of the present invention are made of the article ① or ② or from a material selected from P-BN, quartz and sapphire. The articles ① or ② are much improved in the airtightness as described previously and also, each structure made from the material selected from P-BN, quartz and sapphire originally does not have pores which allow diffusive elements to escape, exhibiting a higher degree of airtightness. Hence, the shape of each crucible is not limited to a particular configuration. For example, a shape similar to that of a crucible used with a pulling method of a bulk crystal growing method may be employed.

The substrate holder and the source crystal holder arranged in a crucible are not limited to the article ① or ② of the present invention or an article made from the material selected from P-BN, quartz and sapphire and may be a common stable material such as graphite, ceramic (e.g. h-BN or $Al_2O_3$), or the like, which undertakes no chemical reaction with a solution of the primary material. It is most preferable that they be the same article ① or ②, or an article made from the material selected from P-BN, quartz and sapphire which are dense materials, as is the crucible, in order to improve airtightness.

The sealing member provided in the upper of a crucible is not particularly specified on condition that it does not allow the primary solution to pass through so that the dispersion of diffusive elements contained in the solution to the outside is prevented and causes no chemical reaction with the solution and the crucible, during the liquid phase epitaxy process. Preferably, a sealing liquid as the sealing member is selected from $B_2O_3$, $BaCl_2$, $CaCl_2$, $Bi_2O_3$, and $Sb_2O_3$ for use with a bulk crystal growing method in e.g. the pulling method which employs a crucible.

The apparatuses ③ and ④ of the present invention are preferably employed for use with a liquid-phase epitaxy (LPE) method. Particularly, the apparatus ④ is most suitable for carrying out a yo-yo solute feeding method which is included in the LPE method. The yo-yo solute feeding method is such a procedure of production as disclosed in "Material for Light Emitting Device and its Production Method" (Japanese Patent Laid-open Publication Nos. 63-81989 (1988) and 61-226275 (1986)). The yo-yo method is named after the periodical increase and decrease of an operating temperature for growing a layer of desired crystal, which is based on the difference between densities of the solution and the solute contained in the solution at the gravity field.

By applying the apparatus ④ of the present invention to the yo-yo solute feeding method, the dispersion of diffusive elements contained in the solution can be avoided drastically even in a comparatively long period of epitaxial growth by the yo-yo method. In practice, the substrate holder arranged in the upper region of the apparatus has a substrate for crystal growth therein while the source crystal holder disposed in the lower region holds a source crystal therein to be a material and a space between the two holders is filled with the primary solution (See FIGS. 4 and 5).

In the present invention, elements with high vapor diffusion are those known in the epitaxial crystal growth technique for the manufacture of various compound semiconductor devices, which elements are exemplified by P, Zn, Se, S, As, etc. Examples of growth solutions containing these elements include GaP and InGaP for yellow-green LED; ZnSe, ZnS and ZnSSe for red LED; InP and GaAs for infrared LD and LED; and InGaAsP and InGaAs for other LDs. The components ①  and ②, and apparatuses ③ and ④ of the present invention can be used most effectively together with the growth solutions mentioned above.

BRIEF DESCRIPTION OF THE DRAWINGS

FIG. 2 is a cross sectional view showing one embodiment of the apparatus ③ according to the present invention;

FIG. 4 is a cross sectional view showing one embodiment of the apparatus ④ according to the present invention.

DETAILED DESCRIPTION OF THE INVENTION

Hereunder, the article and the apparatus of the present invention will be described in detail by way of the embodiments.

First, the description will start with a carbon boat which is a typical porous inorganic structure, by referring to a method of filling a number of tiny pores existing in the carbon boat with an inorganic material and also, a method of coating with amorphous carbon and diamond. Both the shape and arrangement of the carbon boat are of conventionally known.

Figure 1:
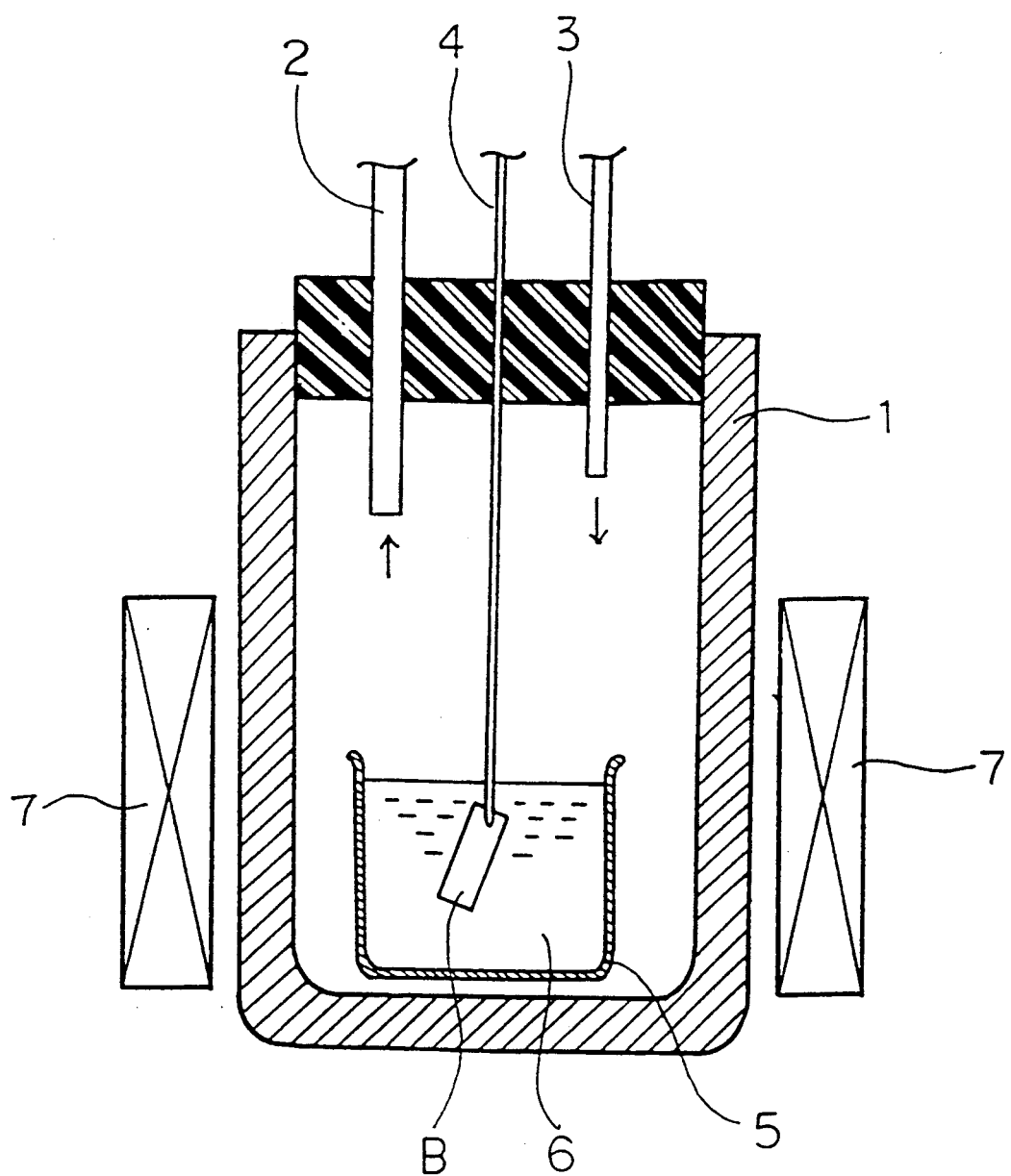
FIG. 1 is a schematic cross sectional view showing an equipment for filling the pores of an inorganic porous structure with an inorganic material for providing an article of the present invention.

FIG. 1 illustrates an equipment for filling the inorganic porous substrate by an immersion procedure, in which there is provided a vacuum container 1 of e.g. silica glass which is coupled with a conduit 2 communicated, in turn, with a vacuum pump (not shown) for rendering the vacuum container 1 vacuum, a conduit 3 for supplying a gas of e.g. $N_2$, $CO_2$, He, Ar or $H_2$ into the vacuum container 1, and a hanger rod 4 inserted thereinto for lifting upward and downward a carbon boat B in the vacuum container 1. A vessel 5 containing a solution 6 of the inorganic material is placed on the bottom of the vacuum container 1 so that the boat B can be immersed into the solution 6 by controlling the hanger rod 4. Also, an electric furnace 7 is provided around the vacuum container 1 for heating the boat B, vessel 5, and solution 6 in the vacuum container 1 to a high temperature.

The procedure for filling the tiny pores in the carbon boat B with the inorganic material using said device will now be described.

The vessel 5 is filled with the solution 6 of a desired inorganic material (e.g. $B_2O_3$) and the carbon boat B to be processed is attached to the hanger rod 4. Then, the vacuum container 1 is airtightly closed and made vacuum by sucking volatile substances therein through the conduit 2.

After the air is pumped out, the vacuum container 1 is heated by the electric furnace 7 to a proper temperature. This heat-up procedure can accelerate the effective removal of remaining gas or steam from the surface region and inside of the carbon boat B made from graphite by vacuum action. Also, by the heating, the inorganic material is melted down to a liquid and its viscosity can be lowered. For example, the viscosity of the inorganic material of e.g. $B_2O_3$ is 3630 poise at 600° C. and reduced to 39.8 poise at 1200° C. Because the vapor pressure of the inorganic material increases with a rise in the temperature, a heating temperature can be adequately determined from the viscosity and the vapor pressure. For $B_2O_3$, the heating temperature is preferably 500° to 1500° C.

After the gas occluded in the carbon boat B is removed by heating and the inorganic material is heated to a predetermined temperature, the boat B is immersed into the solution 6 by using the hanger rod 4 (as best shown in FIG. 1). Simultaneously, a gas of e.g. $N_2$, $CO_2$, He, Ar, or $H_2$ is introduced, as necessary, through the conduit 3 into the vacuum container 1 for exerting pressure onto the solution 6 for adequate time so that the solution 6 can easily penetrate into the pores in the boat B.

The pressure to be applied may be any atmospheric pressure(s) as long as it satisfies the object. For example, the pressure may be one atmospheric pressure, several atmospheric pressures or any other pressure besides these. While the vacuum container 1 remains at a give pressure with the introduction of gas after having a vacuum, the inorganic material is allowed to penetrate into the pores of the carbon boat B during a period of, for example, one minute to one hour. Thereafter, the boat B is lifted out of the solution 6.

The boat B is then removed out from the vacuum container 1 and the remaining solution on the surface of the boat B is removed off with the use of a solvent such as alcohol.

By the foregoing process, the carbon boat, the inorganic article ① of the present invention, can be obtained. The inorganic article ② according to the present invention is prepared by coating the article ① with amorphous carbon or diamond.

The coating with amorphous carbon can be conducted by e.g. a plasma CVD method comprising the steps of baking a carbon boat filled with the inorganic material at 800° to 950° C. under the hydrogen atmosphere for several hours as a preparatory process, placing the boat B in a plasma reactor, introducing a mixture gas of argon and methane, $CH_4$, for producing plasma, which serves as a hydrocarbon gas into the reactor, heating the boat B, if necessary, from the room temperature to about 150° C. and producing a plasma state in the reactor, and depositing amorphous carbon on the surface and the pits of the boat B. After the layer of amorphous carbon is developed to a desired thickness, the plasma state is released and the boat B is removed from the reactor. If necessary, a post-process is carried out by heating the boat B once more under the hydrogen atmosphere.

The coating with diamond is implemented by e.g. a plasma CVD method including after the same preparatory process as of amorphous carbon, the steps of placing a boat B in a plasma reactor, supplying with a mixture gas of methane and hydrogen, heating the boat B to 840° to 860° C., applying a high frequency of 13.5 MHz to the reactor for generating a plasma, and depositing a polycrystalline layer of diamond over the surface and the pits of the boat B. It is preferred that the plasma CVD method is carried out at a pressure of 10 to 100 Torr and with a concentration of methane gas of 0.5 to 5%.

Improved apparatuses ③ and ④ employing the foregoing inorganic components or other components made from a material selected from P-PN, quartz and sapphire will now be described.

An apparatus A for LPE is shown in FIG. 2 in which a substrate for crystal growth is placed beneath a solution. A substrate holder 11 for retaining the substrate 13 for crystal growth is disposed closely on the bottom of a crucible body 10.

Also, a sealing liquid 17 of e.g. $B_2O_3$ is provided above and at a distance from the substrate holder 11 for trapping the solution 30 at said place.

Figure 3:
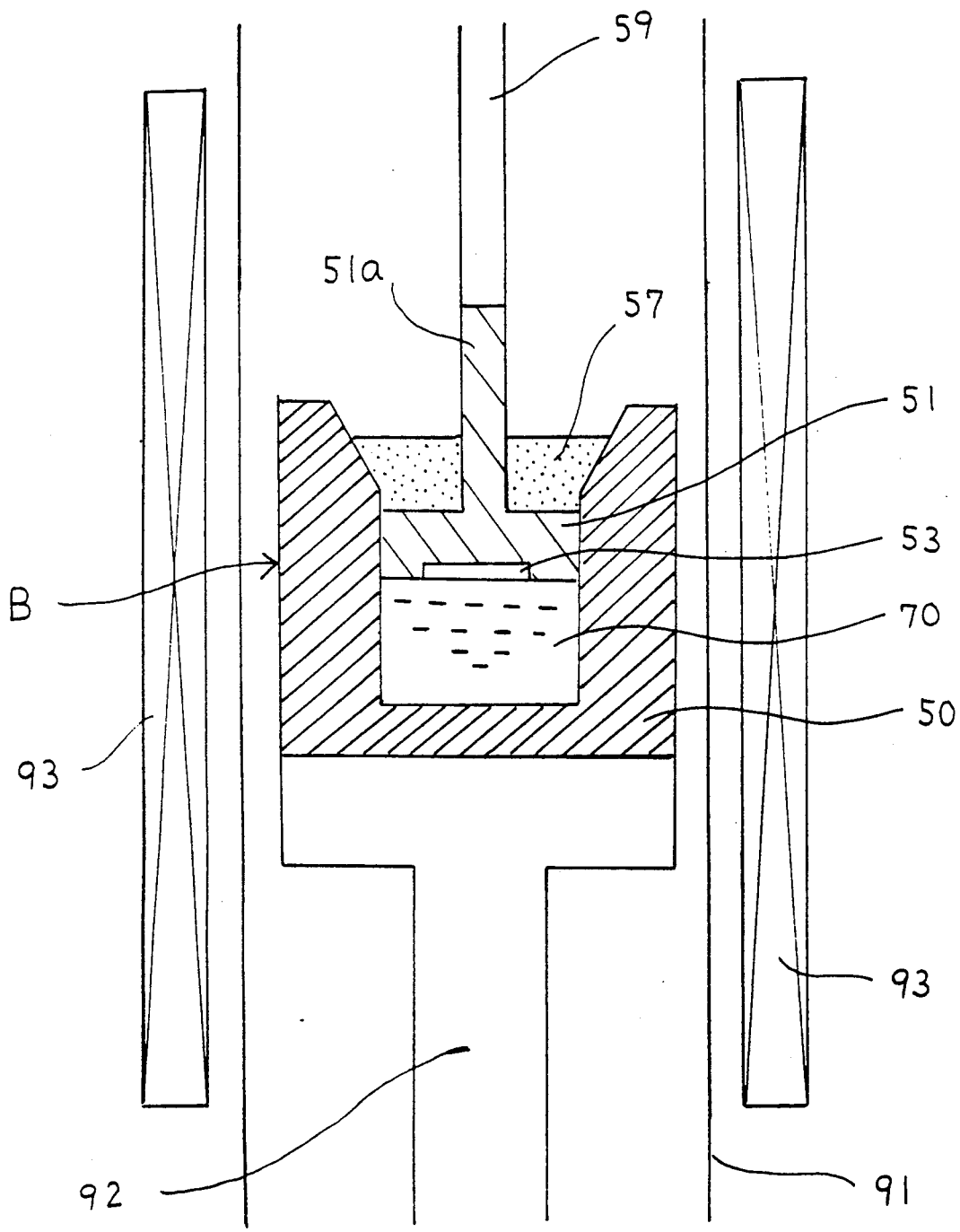
FIG. 3 is a cross sectional view showing another embodiment of the apparatus ③ according to the present invention.

Although not specifically explained in Figure, the liquid phase epitaxy with the apparatus A may be conducted by such an arrangement as shown in FIG. 3, which is associated with the pulling method of bulk crystal growth. In operation, the substrate 13 is placed on the substrate holder 11 and the solution 30 is supplied and sealed in with the sealing liquid 17 supplied on solution 30. Then, the solution 30 is heated to a temperature for starting the crystal growth and slowly cooled down to grow the crystals having a desired composition on the substrate 13. After the growth, the sealing liquid 17 and the solution 30 are discharged and the substrate 13 is taken out from the apparatus.

FIG. 3 illustrates an LPE apparatus B in which a substrate is disposed directly on the upper surface of a solution while a substrate holder is arranged to slide upward and downward. More particularly, the substrate holder 51 is slidably disposed in a crucible body 50. Also, a rod 59 is mounted to a central projection 51a of the substrate holder 51 so that the substrate holder 51 can be moved upward and downward from the outside of the apparatus. A sealing liquid 57 (of e.g. $B_2O_3$) for trapping the solution 70 is provided above the substrate holder 51. As shown in Figure, the apparatus B is disposed on a base 92 arranged in a perpendicularly-disposed reactor 91 made from quarts, etc. as is common in the pulling process of the bulk crystal growth. An electric furnace 93 extends around the reactor 91 in concentric circle.

In operation of the apparatus B for epitaxial growth, the substrate holder 51 is lifted down to the upper level of the solution 70 contained in the body 50 by actuating the rod 59 and simultaneously, the sealing liquid 57 is supplied onto the substrate holder 51. After heating the solution 70 to a temperature for starting crystal growth with the electric furnace 93, the substrate holder 51 is lowered by the rod 59 in order to allow the substrate 53 to come into contact with the upper surface of the solution 70. Then, the epitaxial growth is effected on the substrate 53 while slowly cooled down. After the epitaxial growth, the substrate holder 51 is lifted up by the rod 59 to separate the substrate 53 from the solution 70.

Accordingly, the upward and downward movement of the substrate holder 51 by the rod 59 allows the solution to come into contact with the substrate after heated up to the crystal growth starting temperature, thus minimizing the melt-back of the substrate into the solution and ensuring quick separation of the substrate from the solution after the crystal growth. Hence, the deposition of poly-crystal materials on the surface of a growth layer and also, the damage on the surface of a epitaxial layer can be avoided and high quality crystals can be obtained.

An apparatus C most suitable with the yo-yo solute feeding method is shown in FIG. 4 in which a source crystal holder 21 for retaining a source crystal 23 is disposed closely on the bottom of a crucible body 20 and a substrate holder 22 for retaining a substrate 24 for crystal growth is detachably mounted above and at a distance from the source crystal holder 21. Also, a sealing liquid 27 of e.g. $B_2O_3$ is provided over the substrate holder 22 for trapping a solution 40 between the upper and lower holders 22 and 21.

For epitaxial growth with the apparatus C, the supply of the solution 40 follows the placement of the source crystal 23 on the source crystal holder 21 and the substrate holder 22 is mounted to the upper region of the body 20 so that the substrate 24 comes into contact with the upper surface of the solution 40. Then, the sealing liquid 27 is supplied onto the substrate holder 22. As the source crystal 23 is released into the solution 40 by means of the yo-yo solute feeding method or a procedure of periodical increase and decrease of the temperature, a desired epitaxial layer is grown on the upper substrate 24. After the growth of the epitaxial layer, the substrate holder 22 is removed out from the body 20.

Figure 5:
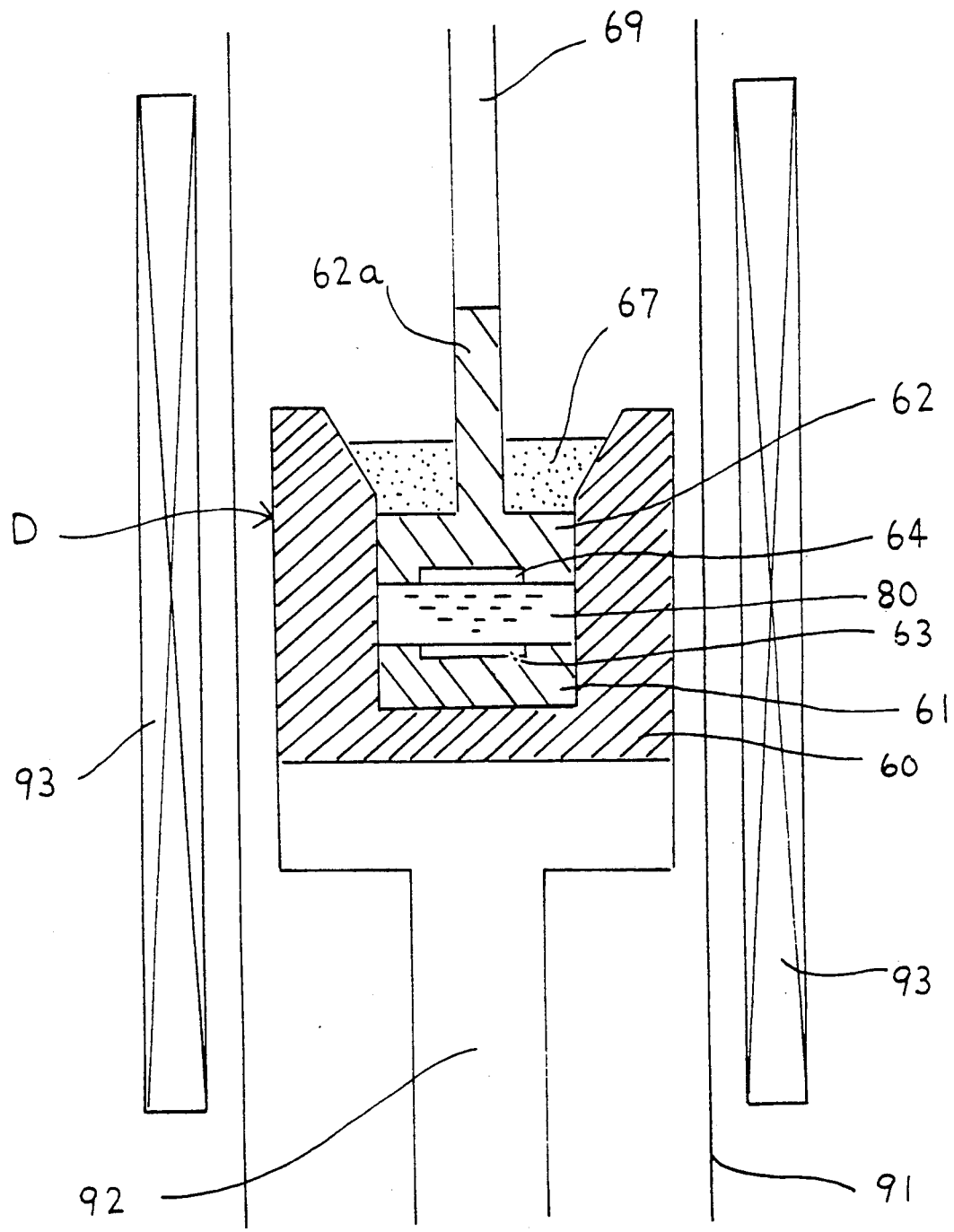
FIG. 5 is a cross sectional view showing another embodiment of the apparatus ④ according to the present invention.

An apparatus D shown in FIG. 5 is a modification of the apparatus C in FIG. 4 and associated with the yo-yo solute feeding method, in which a substrate holder is arranged for vertical sliding movement like the same of the apparatus B shown in FIG. 3. More specifically, the substrate holder 62 is provided for sliding movement in a crucible body 60 and has a projection 62a arranged in the central region thereof and coupled to a rod 69 for the upward and downward movement. Like the apparatus B, the apparatus D is placed on a base 92 in a reactor 91 which is encircled by an electric furnace 93.

The epitaxial growth with the apparatus D is similar to that with the apparatus C. It is understood that like the apparatus B, the actuation of the rod 69 involves the engagement and disengagement of the substrate 64 with and from the solution 80 during a step of liquid phase epitaxy by the yo-yo solute feeding method.

EXAMPLES 1 TO 9 AND COMPARISONS 1 AND 2

Examples of the present invention will be described for clarifying how little the dispersion of diffusive elements is involved with the improved inorganic components of the present invention.

The graphite crucibles were employed as porous inorganic articles, and a test for examining the dispersion of diffusive elements was conducted using those processed with filling with an inorganic material (Examples 1 to 3); those further coated with amorphous carbon after the filling process (Examples 4 to 6); those coated with diamond after the filling process (Examples 7 to 9); one without any process done (Comparison 1), and a ceramic crucible (of $Al_2O_3$) not processed (Comparison 2) by the following test method, the results of which are summarized in Table 1. The crucibles employed had the structure shown in FIG. 2 and were of the same size and shape.

Test Procedure

In the Examples and Comparisons, the solution for epitaxial growth employs InP and is supplied to each crucible at equal concentration and amount, and the upper surface thereof is sealed in with a sealing liquid of $B_2O_3$. Then, the InP solution is maintained at 900° C. for 9 hours and the dispersion of P which is a diffusive element contained in the solution is calculated from the following formula.

The dispersion is expressed by a percentage of the decreased weight of P in the InP solution (weight of dispersed P) after 9 hours of keeping, to the original weight of P in the solution before the keeping. The vapor pressure of P is 0.023 atm while the solution is maintained at 900° C.

$$\text{Percentage (\%)} = \frac{\text{Weight of decreased } P}{\text{Weight of } P \text{ before heating}}$$

TABLE 1

| | inorganic material to be filled | thickness of amorphous carbon layer μm | thickness of diamond layer μm | percentage of dispersion (%) |
|---|---|---|---|---|
| Ex. 1 | $B_2O_3$ | — | — | 9 |
| Ex. 2 | $Bi_2O_3$ | — | — | 12 |
| Ex. 3 | $Sb_2O_3$ | — | — | 12 |
| Ex. 4 | $B_2O_3$ | 10 | — | 2 |
| Ex. 5 | $Bi_2O_3$ | 10 | — | 3.5 |
| Ex. 6 | $Sb_2O_3$ | 10 | — | 4 |
| Ex. 7 | $B_2O_3$ | — | 10 | 1.5 |
| Ex. 8 | $Bi_2O_3$ | — | 10 | 3.5 |
| Ex. 9 | $Sb_2O_3$ | — | 10 | 3.5 |
| Com. Ex. 1 | — | — | — | 27 |
| Com. Ex. 2 | — | — | — | 30 |

What is claimed is:

1. An inorganic article for contacting a solution or diffusive elements contained in the solution for crystal growth in the shape of a crucible, container, boat or lit comprising a porous inorganic structure having pores thereof filled with an inorganic material having a melting point of 400° to 900° C.

2. An inorganic article for contacting a solution or diffusive elements contained in the solution for crystal growth in the shape of a crucible, container, boat or lid according to claim 1, wherein a surface of the porous inorganic structure is additionally coated with a member selected from the group consisting of amorphous carbon and diamond.

3. An inorganic article for contacting a solution or diffusive elements contained in the solution for crystal growth in the shape of a crucible, container, boat or lid according to claim 1, wherein the porous inorganic structure is formed of a material selected from the group consisting of graphite and ceramic.

4. An inorganic article for contacting a solution or diffusive elements contained in the solution for crystal growth in the shape of a crucible, container, boat or lid according to claim 1, wherein the inorganic material has a boiling point of more than 1500° C.

5. An inorganic article for contacting a solution or diffusive elements contained in the solution for crystal growth in the shape of a crucible, container, boat or lid according to claim 1, wherein the inorganic material has a vapor pressure less than 5 mm Hg at a temperature of 900° C.

6. An inorganic article for contacting a solution or diffusive elements contained in the solution for crystal growth in the shape of a crucible, container, boat or lid according to claim 1, wherein the inorganic material is selected from a group consisting of $B_2O_3$, $Bi_2O_3$, and $Sb_2O_3$.

7. An inorganic article for contacting a solution or diffusive elements contained in the solution for crystal growth in the shape of a crucible, container, boat or lid according to claim 2, wherein the porous inorganic structure is formed of a material selected from the group consisting of graphite and ceramic.

8. An inorganic article for contacting a solution or diffusive elements contained in the solution for crystal growth in the shape of a crucible, container, boat or lid according to claim 2, wherein the inorganic material has a boiling point of more than 1500° C.

9. An inorganic article for contacting a solution or diffusive elements contained in the solution for crystal growth in the shape of a crucible, container, boat or lid according to claim 2, wherein the inorganic material has a vapor pressure less than 5 mmHg at a temperature of 900° C.

10. An inorganic article for contacting a solution or diffusive elements contained in the solution for crystal growth in the shape of a crucible, container, boat or lid according to claim 2, wherein the inorganic material is a member selected from the group consisting of $B_2O_3$, $Bi_2O_3$, and $Sb_2O_3$.

11. An inorganic article for contacting a solution or diffusive elements contained in the solution for crystal growth according to claim 1, wherein the article is in the shape of a boat.

12. An inorganic article for contacting a solution or diffusive elements contained in the solution for crystal growth according to claim 1, wherein the article is in the shape of a crucible.

13. An inorganic article for contacting solution or diffusive elements contained in the solution for crystal growth according to claim 1, wherein the article is in the shape of a lid.

14. An inorganic article for contacting solution or diffusive elements contained in the solution for crystal growth according to claim 2, wherein the article is in the shape of a crucible.

15. A liquid-phase epitaxy apparatus for crystal growth comprising a crucible having a porous inorganic structure with pores thereof filled with an inorganic material having a melting point of 400° to 900° C., a substrate holder arranged in the crucible, and a sealing member suspended above the substrate holder for containing a solution for epitaxial growth within the crucible.

16. The liquid-phase epitaxy apparatus of claim 15, further comprising a source crystal holder arranged in a bottom of the crucible, wherein the substrate holder is arranged above and at a distance from the source crystal holder and the sealing member is arranged above both the source crystal and substrate holders.

17. The liquid-phase epitaxy apparatus of claim 15, wherein a surface of the porous inorganic structure is additionally coated with a member selected from the group consisting of amorphous carbon and diamond.

18. The liquid-phase epitaxy apparatus of claim 16, wherein a surface of the porous inorganic structure is additionally coated with a member selected from the group consisting of amorphous carbon and diamond.

* * * * *